United States Patent [19]

Dawson et al.

[11] Patent Number: 5,621,615

[45] Date of Patent: Apr. 15, 1997

[54] LOW COST, HIGH THERMAL PERFORMANCE PACKAGE FOR FLIP CHIPS WITH LOW MECHANICAL STRESS ON CHIP

[75] Inventors: Peter F. Dawson, deceased, late of Portola Valley, Calif., by Shirley B. Dawson, executrix; Jacques Leibovitz, San Jose; Voddarahalli K. Nagesh, Cupertino, both of Calif.

[73] Assignee: Hewlett-Packard Company, Palo Alto, Calif.

[21] Appl. No.: 415,114

[22] Filed: Mar. 31, 1995

[51] Int. Cl.⁶ ..................................................... H05K 7/20
[52] U.S. Cl. .................. 361/704; 165/80.4; 174/16.3; 257/707; 257/713; 257/719; 361/715; 361/718
[58] Field of Search .................. 165/80.4, 185; 174/16.3; 257/713, 707, 718–719, 726–727, 697; 361/704–705, 707, 710, 714–722, 816, 818

[56] References Cited

U.S. PATENT DOCUMENTS

| 4,561,011 | 12/1985 | Kohara et al. | 174/16.3 |
| 4,649,990 | 3/1987 | Kurihara et al. | 165/80.4 |
| 4,658,334 | 4/1987 | McSparran et al. | 361/818 |
| 5,089,936 | 2/1992 | Kojima et al. | 361/707 |

*Primary Examiner*—Gregory D. Thompson
*Attorney, Agent, or Firm*—Denise A. Lee; Timothy R. Croll

[57] ABSTRACT

The flip chip package described is comprised of a substrate, a ring structure attached to the substrate, a heat removal structure, and a chip thermally coupled to the heat removal structure. The package lid is comprised of a ring structure and a heat removal structure. The ring structure and heat removal structure are separated until after attachment of the ring structure to the substrate allowing the ring structure to be brazed to the substrate. Brazing the ring structure to the substrate decreases the mechanical stress to the chip. A die attach material, between the first major surface of the die and the first major surface of the heat removal structure, adheres the die to and thermally couples the die to the heat removal structure. The die attach layer is of a predetermined thickness and thus provides a determined low thermal resistance making the thermal performance of the package certain.

5 Claims, 11 Drawing Sheets

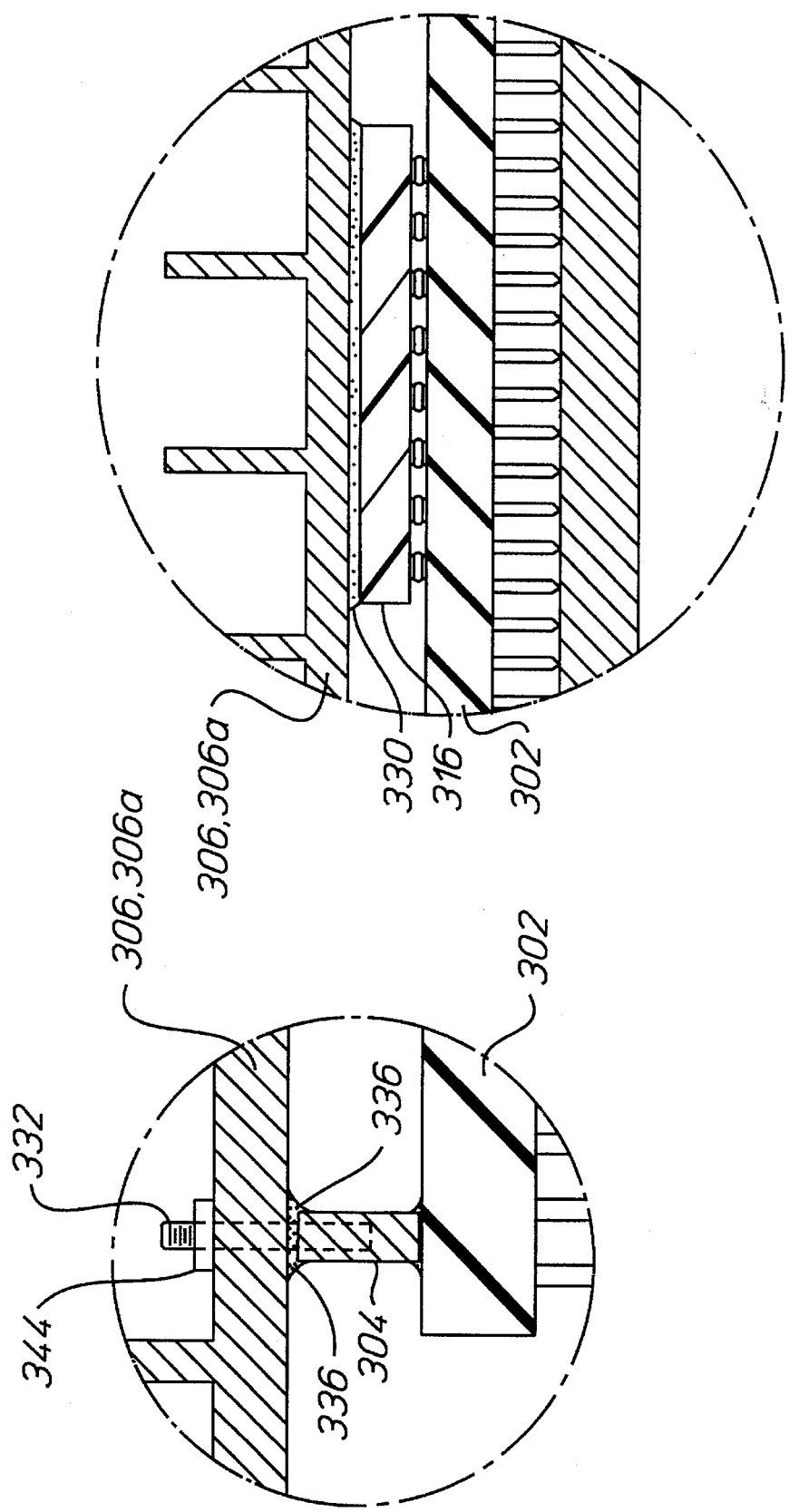

LOW COST, HIGH THERMAL PERFORMANCE PACKAGE FOR FLIP CHIPS WITH LOW MECHANICAL STRESS ON CHIP

BACKGROUND OF THE INVENTION

As the number of I/O interconnections to integrated circuit chip increases, forming the required number of I/O pads around the chip periphery becomes impractical. One solution which provides increased I/O density is the "flip chip" package. The flip chip package has an area array configuration which increases the number of interconnections available compared to standard IC packages. Instead of electrically interconnecting the chip using wire bonding techniques, solder bumps are formed on the input/output pads of the chip. The chip is flipped so that its solder bumps are aligned to a connecting pattern formed on a ceramic substrate. The temperature is then increased to cause the solder bumps to reflow for direct bonding of the I/O pads of the chip to contact sites on the substrate.

To improve device reliability the chip is insulated from the environment and from mechanical stresses initiated by the heat sink by surrounding the chip with a sealed lid. Typically, the lid is a unitary structure formed from a conductive material. The lid serves to convey directly mechanical stress from the heat sink to the ceramic substrate instead of through the chip. The mechanical stress from the heat sink results from momentum changes imparted to the heat sink (large mass) during velocity changes caused by mechanical shock and/or vibrations.

Referring to FIGS. 1A–C, FIG. 1A shows a package 100 which provides a semi-hermetic seal by mechanically contacting the lid 102 to the substrate 104 with an adhesive seal 106. In the package 100 of FIG. 1A, inset FIG. 1C shows, the rim 108 of the package lid 102 directly contacts the substrate 104 so that lid placement is held by the sealant 106 which forms a fillet on the sides of the lid rim 108. Since the height 118 of the lid rim 108 is greater than the summation of the heights of the chip 110 and the electrical interconnections 112 between the chip 110 and the substrate 104, sufficient die attach material 114 must be placed on the chip backside (or the lid ceiling) to fill the space between the chip 110 and the lid ceiling 116. One problem with this approach is that the clearance between the chip 110 and the lid ceiling 116 varies dependent on the sum of the variations in the lid depth, the chip thickness, the height of the solder bumps and other variables. This variation in clearance, in turn, translates into a variation in the thickness of the die attach material. This variance in die attach material thickness results in varying thermal resistance making thermal performance of the package uncertain.

In order to overcome the inconsistency in thermal performance of the previously described package, a package structure and method of formation disclosed in a case filed Oct. 10, 1994, having Ser. No. 319,764 was described and is shown in FIGS. 2A–C. The package lid 206 of package structure 200 is typically formed of a Kovar ring structure 214 and a copper tungsten (CuW) coverplate 216 which are brazed together before attachment to the substrate 208. In contrast to the previously described system shown in FIGS. 1A–C, a predetermined thickness of die attach material 202 is applied between the chip 204 and lid 206 so that thermal performance is certain. Further, the height 218 of the rim of the lid is made less than the summation of the heights of the chip 204, the electrical interconnections between the chip 204 and the substrate 208, and the die attach layer 202. The clearance between the rim 210 of the lid and the substrate 208 is filled with a lid attach material 212 having a height 220. Thus, instead of the die attach material 202 taking into account variances in chip thickness, solder bump height, etc., in the package shown in FIGS. 2A–C variances are taken into account by the lid attach material 212 between the rim of the lid and the substrate 208.

Although the package shown in FIGS. 2A–C reduces problems of thermal inconsistency, the package shown in FIGS. 2A–C increases mechanical stress to the chip compared to the package in FIG. 1. Excess mechanical stress is problematic in that it may fracture the chip or alternatively may create microcracks which propagate through the chip and may result in device failure. In FIGS. 1A–C, stress applied to the package lid will be disproportionately transferred to the ceramic substrate compared to the stresses applied to the chip. Because in the embodiment of FIGS. 2A–C attachment between the lid rim and substrate does not provide as firm a mechanical contact as the direct contact shown in FIGS. 1A–C, increased mechanical stress will be delivered to the chip.

A package that provides a repeatable low thermal resistance value, consistency in fabrication and low mechanical stress to the chip at a low cost is needed.

SUMMARY OF THE INVENTION

The present invention is a package which provides a low thermal resistance value with decreased mechanical stresses applied to the chip. The package is comprised of a substrate, a ring structure attached to the substrate, a heat removal structure, and a chip thermally coupled to the heat removal structure. Typically, the ring structure is brazed to the substrate providing direct mechanical contact to the substrate, decreasing the mechanical stress to the chip. A die attach material, between the first major surface of the die and the first major surface of the heat removal structure, adheres the die to and thermally couples the die to the heat removal structure. The die attach layer is of a predetermined thickness and thus provides an invariant thermal resistance making the thermal performance of the package certain.

In a first embodiment, the heat removal structure is comprised of a heat sink and a coverplate. In an alternative embodiment, the heat removal structure eliminates the coverplate and thus is comprised only of a heat sink. This alternative embodiment decreases package cost by eliminating the cost of the coverplate and increases thermal efficiency by directly coupling the integrated circuit chip to the heat sink.

The method of forming the integrated circuit package comprises the steps of: attaching a ring structure to a substrate; electrically interconnecting the integrated circuit chip to the substrate; attaching the integrated circuit chip to a heat removal structure; and attaching the ring structure to the heat removal structure, wherein the step of attaching the ring structure to the substrate occurs before the step of attaching the ring structure to the heat removal structure.

In the preferred embodiment, the ring structure is attached to the substrate by brazing. Typically, the step of brazing the ring structure to the substrate is performed before the step of electrically interconnecting the integrated circuit chip to the wiring pattern formed on the substrate. This is because the high temperatures typically associated with brazing may damage the integrated circuit chip.

In the present invention, the package lid is comprised of a ring structure in combination with a heat removal structure. The heat removal structure may be a heat sink or a combination of a heat sink and coverplate. In the past, package lids typically were comprised of a ring structure and coverplate. Typically in conventional package lids, the ring structure and coverplate were typically a unitary structure or alternatively were fused into a unitary structure before attachment to the substrate. However, in the present invention the ring structure is separated from the coverplate at the time of attachment to the substrate. Separating the ring structure from the coverplate, allows the ring structure to be attached to the substrate by brazing before electrical interconnection of the integrated circuit. Brazing the ring structure to the substrate provides direct mechanical contact decreasing mechanical stress to the chip.

A further understanding of the nature and advantages of the invention described herein may be realized by reference to the remaining portion of the specification and the attached drawings.

BRIEF DESCRIPTION OF THE DRAWINGS

FIG. 1A is a schematic cross-sectional view of a prior art flip chip package in which

FIG. 4B shows the heat removal structure interface and the electrical connection of FIG. 4A in further detail. FIG. 4C shows the chip to lid attachment of FIG. 4A in further detail.

DETAILED DESCRIPTION OF THE PREFERRED EMBODIMENTS

Figure 1A:
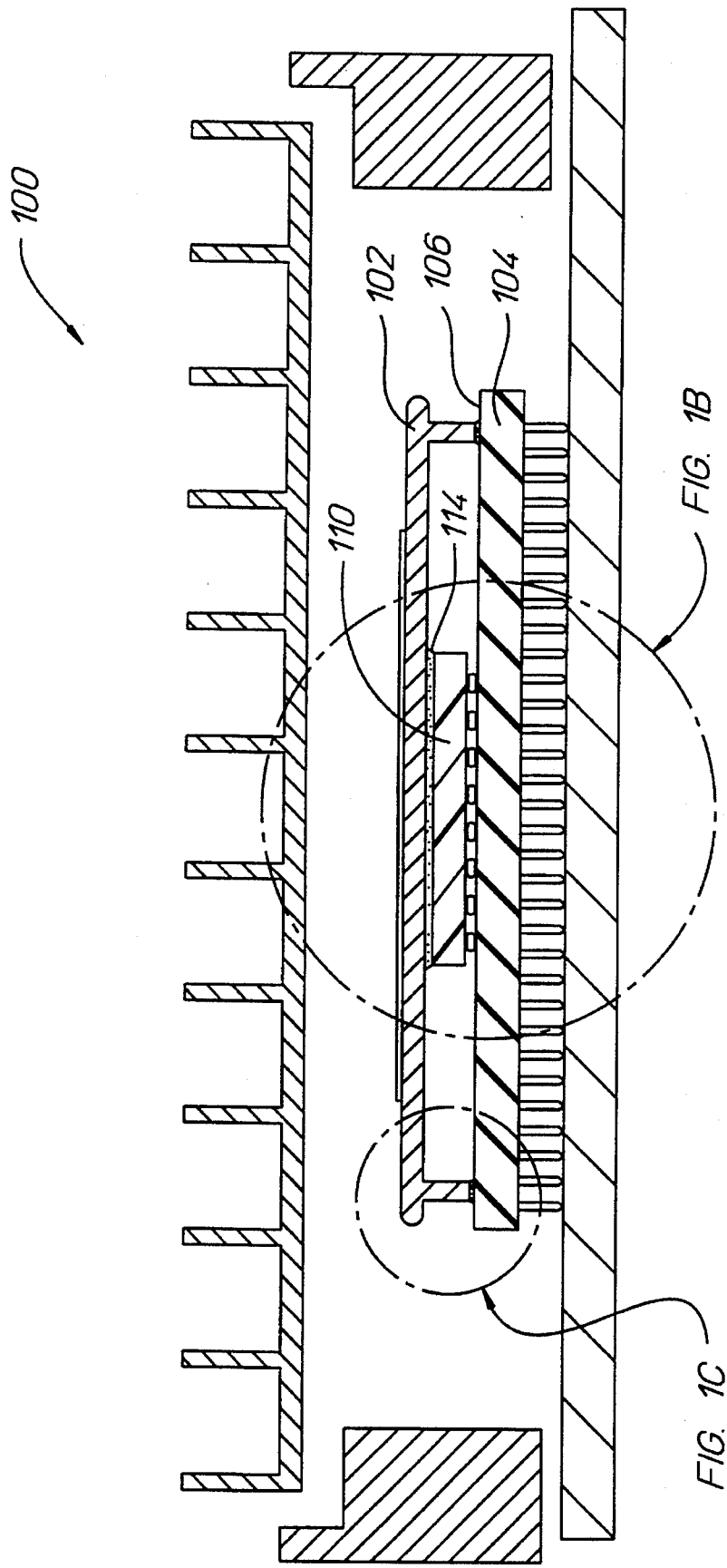

Referring to FIGS. 3A–D and 4A–D, the flip chip package 300 according to the present invention is comprised of a substrate 302, a ring structure 304 attached to the substrate 302, a heat removal structure 306, and a chip 316 thermally coupled to the heat removal structure 306. The substrate 302 is typically a ceramic substrate having a first major surface 308 and second major surface 310. A first connecting pattern of conductive pads 312 is formed on the first major surface 308 of the substrate, the first connecting pattern 312 matching a connecting pattern of conductive pads 313 formed on the integrated circuit chip 316. Solder bumps 314 or other suitable means of electrical interconnect electrically couple the connecting pattern 312 to the connecting pattern 313.

The integrated circuit chip 316 has a first major surface 318 and a second major surface 320, where the second major surface 320 is the active side of the integrated circuit chip 316.

The integrated circuit chip 316 is mounted so that the connecting pattern 313 on the active side of the chip matches the connecting pattern 312 on the first major surface 308 of the substrate 302. Solder bumps 314 or other suitable electrical connections form interconnects between the active side 320 of the integrated circuit chip 316 and the first major surface 308 of the substrate. The space between the solder bumps is typically filled with a resin referred to as the underfill. This resin has thermomechanical properties which increase the life of the electrical connections.

To protect the integrated circuit chip from the environment and from mechanical stresses due to momentum imparted to the heat removal structure by mechanical shock or vibration, a sealed lid is formed around the integrated chip. Together, the heat removal structure 306, ring structure 304 and substrate 302 form a closed structure around the die providing protection against the environment and against mechanical stress. In the present invention, the lid is comprised of a ring structure 304 and heat removal structure 306 attached to each other. In the preferred embodiment, the ring structure 304 and heat removal structure 306 are attached to each other by an adhesive. Alternatively, the ring structure 304 and heat removal structure 306 may be attached to each other by soldering.

In the preferred embodiment, the ring structure 304 positioned between the substrate 302 and the heat removal structure 306, has an open top and bottom and a cross-section along its longitudinal axis that is rectangular. Although, in the preferred embodiment the ring structure is rectangular in cross-section, the cross-section of the closed figure is not critical and may for example be circular, elliptical, triangular or irregularly shaped. It is only critical that the perimeter of the ring structure be larger than the perimeter of the integrated circuit chip.

Figure 3A:
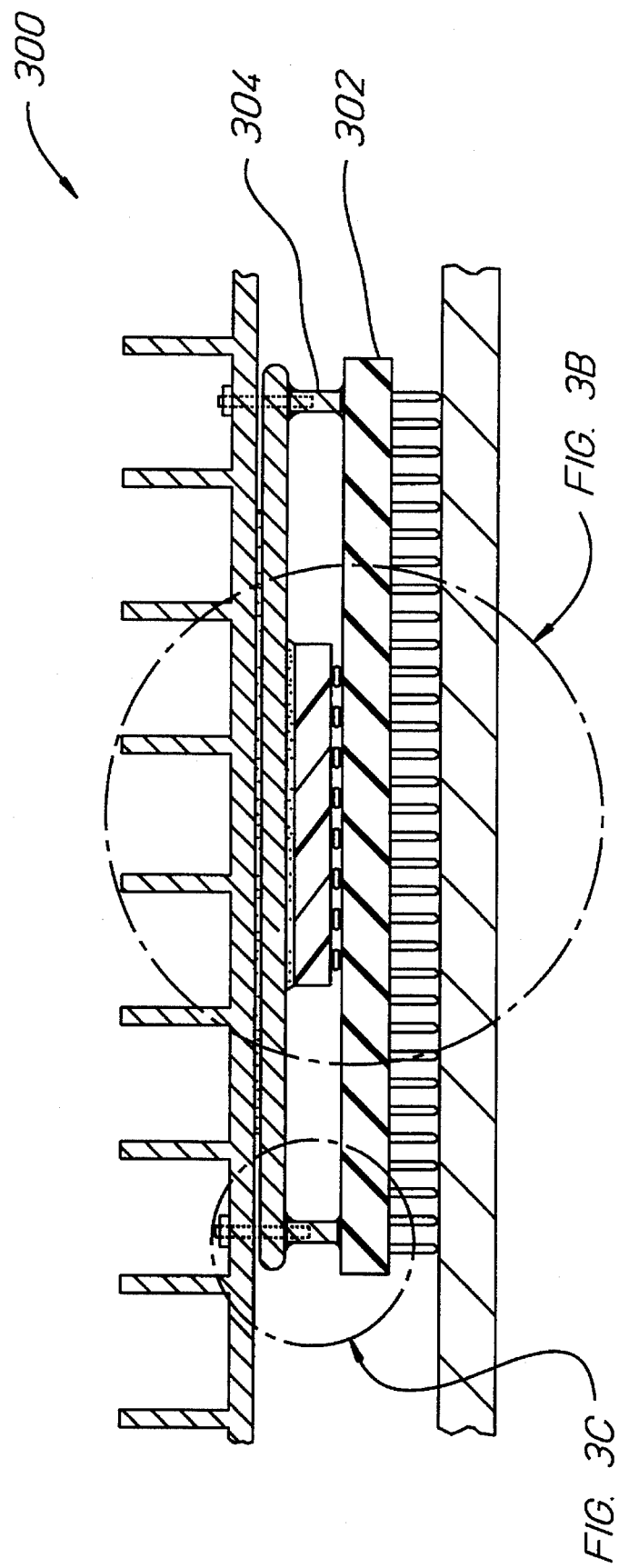
FIG. 3A is a schematic cross-sectional view of a package according to one embodiment of the present invention.
Figures 3B, 3C:
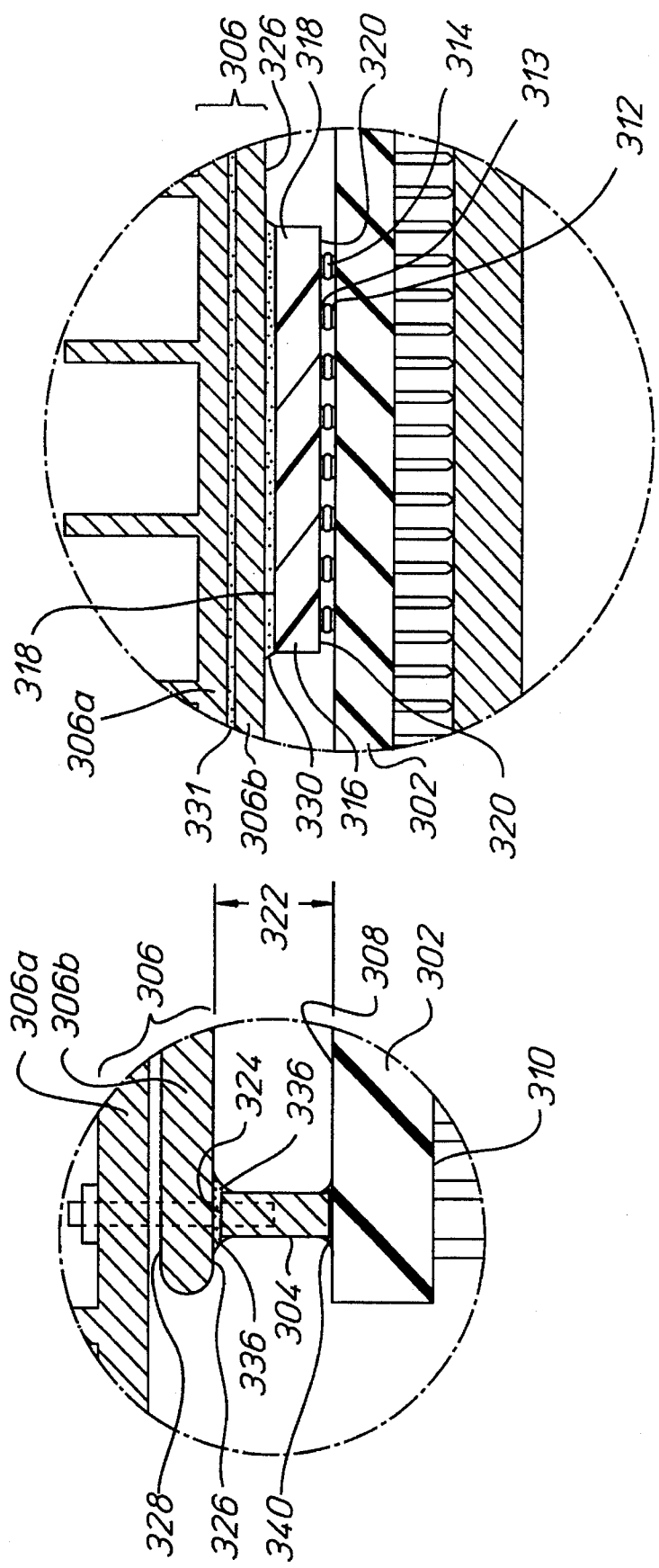
FIG. 3B shows the chip to heat removal structure interface and the electrical connection of FIG. 3A in further detail.
FIG. 3C shows the chip to lid attachment of FIG. 3A in further detail.

In the embodiment shown in FIG. 3A, for example, a single chip is shown mounted on the substrate inside the ring structure. In alternative embodiments there may be additional pads around the array for passive elements, inside or outside the ring structure. Further, there may be more than one chip inside the ring structure and attached to the heat removal structure.

The material from which the ring structure 304 is made should have a thermal coefficient-of-expansion closely matched to the substrate material. In the preferred embodiment, the substrate 302 is a ceramic such as aluminum oxide and the ring structure is made of kovar. Kovar is an iron-nickel alloy having a high percentage of iron which provides an excellent thermal coefficient-of-expansion match to the aluminum oxide substrate.

Although the material kovar provides an excellent thermal coefficient-of-expansion (TCE) match to the substrate, kovar does not provide good thermal conductivity. Therefore, the heat removal structure 306 is not made of kovar, but instead is made of a material which provides good thermal conductivity. In one embodiment, the heat removal structure 306 is made of copper tungsten (CuW). In addition to providing good thermal conductivity, CuW has a temperature coefficient-of-expansion (TCE) which is matched to the ring structure. Although, copper tungsten is preferred, other materials having a high thermal conductivity such as aluminum silicon carbide or aluminum nitride may be used. Additionally, a good thermal conductor with an unmatched TCE (such as aluminum) may be used with a compliant lid attach material such as sylgard, as an example. In the latter case, the die(to heat sink) attach material is a thermal grease to avoid mechanical stress to the chip that would otherwise occur, because of the unmatched TCE.

The ring structure 304 is typically positioned so that its sidewalls are generally orthogonal to the substrate. Typically, the ring structure 304 is brazed to the substrate 302, although other means of attachment may be used. The heat removal structure 306, is typically positioned on the top surface 318 of the chip and above the top surface 324 of the ring structure 304, with its first and second major surfaces 326, 328 generally parallel to the first and second major surfaces of the substrate. In the embodiment shown in FIGS. 3A–D, the heat removal structure 306 includes a heat sink 306a and a coverplate 306b. In the embodiment shown in FIGS. 4A–D, the heat removal structure 306 is a heat sink 306a. Also, instead of a heat sink 306 as shown in FIGS. 3A–D and 4A–D, other heat removal devices can be used including but not limited to pelletier junctions or heat pipes.

FIGS. 3A–D show a heat removal structure 306 which includes both a heat sink and a coverplate 306b. The coverplate 306b is attached to the integrated circuit chip 316 by a die attach layer 330 having a predetermined thickness. A lid attach material 336 having variable thickness attaches the ring structure to the heat removal structure 306, in FIGS. 3A–D the coverplate 306b. The variance in the thickness of the lid attach layer 336 takes into account variances in the thickness or heights of the ring structure, the chip, the electrical interconnections between the chip and the substrate, and the die attach layer, etc. The summation 322 of the heights of the chip, the electrical interconnection between the chip and the substrate, and the die attach layer is greater than or equal to the height of the ring structure. Therefore it accounts also for variations in the height of that ring and planarity tolerances of the substrate surface.

The coverplate 306b acts to remove heat from the chip 316 and helps protect the chip 316 from the environment. Typically, a layer of adhesive 331 such as thermal grease is placed between the coverplate 306b and the heat sink 306a. The thermal grease attaches the coverplate 306b to the heat sink 306a, yet allows easy removal of the heat sink 306a.

Figure 5:
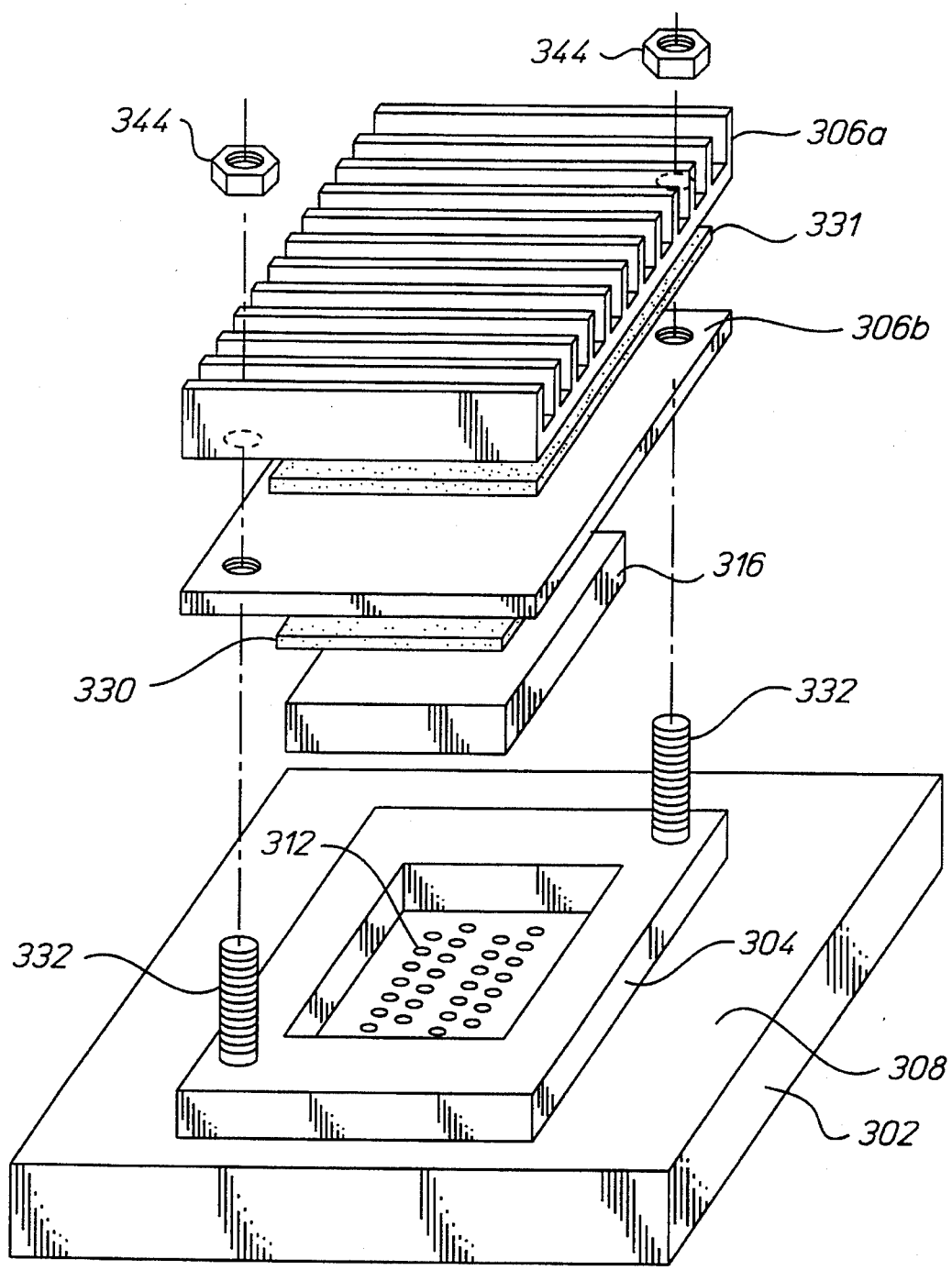
FIG. 5 is an exploded view of the package according to the embodiment shown in FIG. 3A–D where the fastening means to the heat removal structure is shown.

Referring to FIG. 5, a fastening means 332 attaches the ring structure 304 to the coverplate 306b and heat sink 306a. A fastening means 332 extending from the ring structure 304 mechanically couples the ring structure 304 to the heat removal structure 306. In the preferred embodiment the fastening means 332 is attached, preferably by brazing, inside an opening formed in the ring structure. Alternatively, the fastening means may be attached to the surface of the ring structure.

Figure 3D:
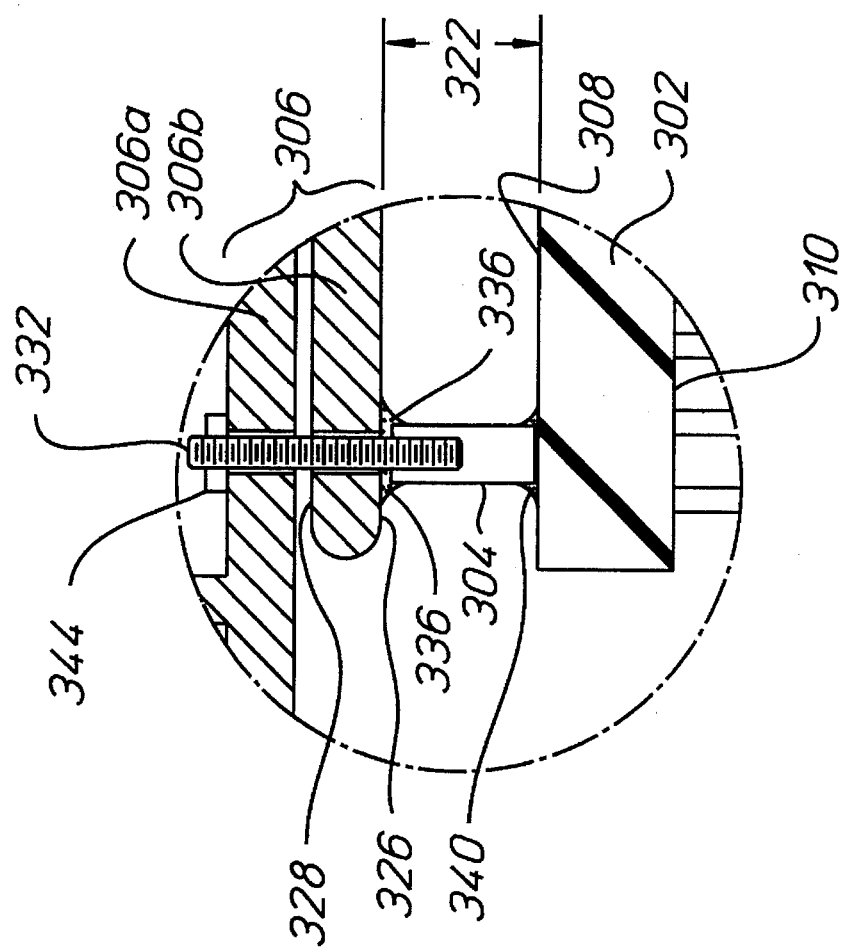
FIG. 3D shows the chip to lid attachment of FIG. 3A in further detail where the cross-sectional view of the lid attachment is taken through the fastening means.
Figure 4A:
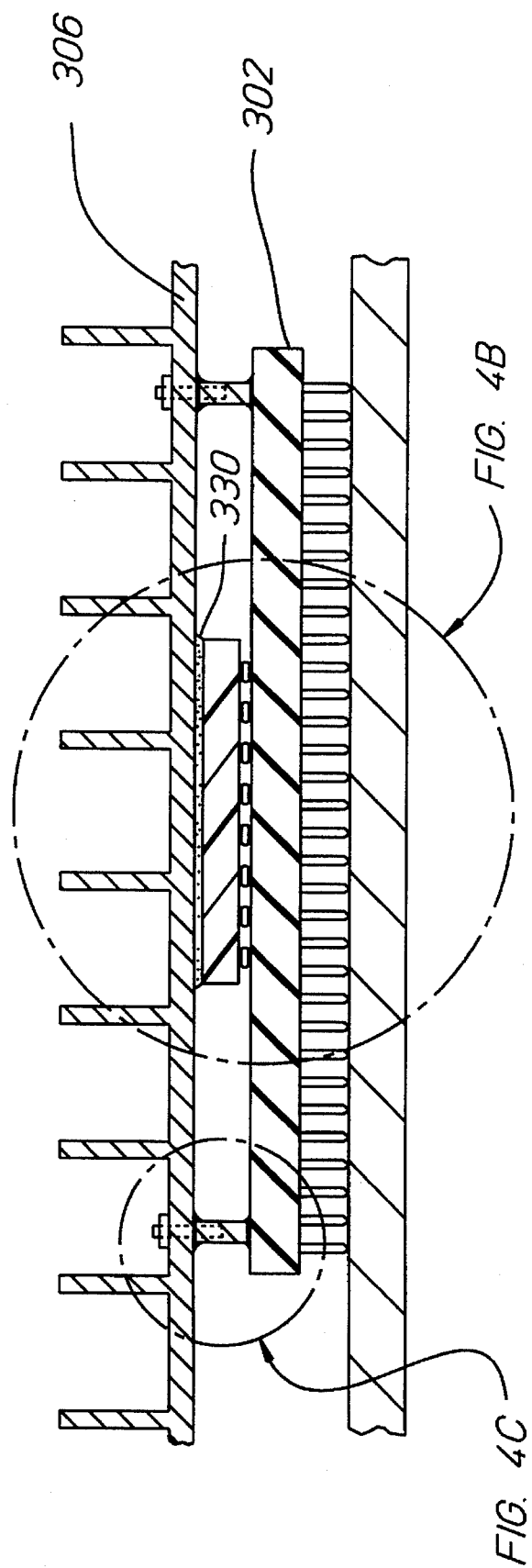
FIG. 4A is a schematic cross-sectional view of a package according to an alternative embodiment of the present invention.
Figure 4D:
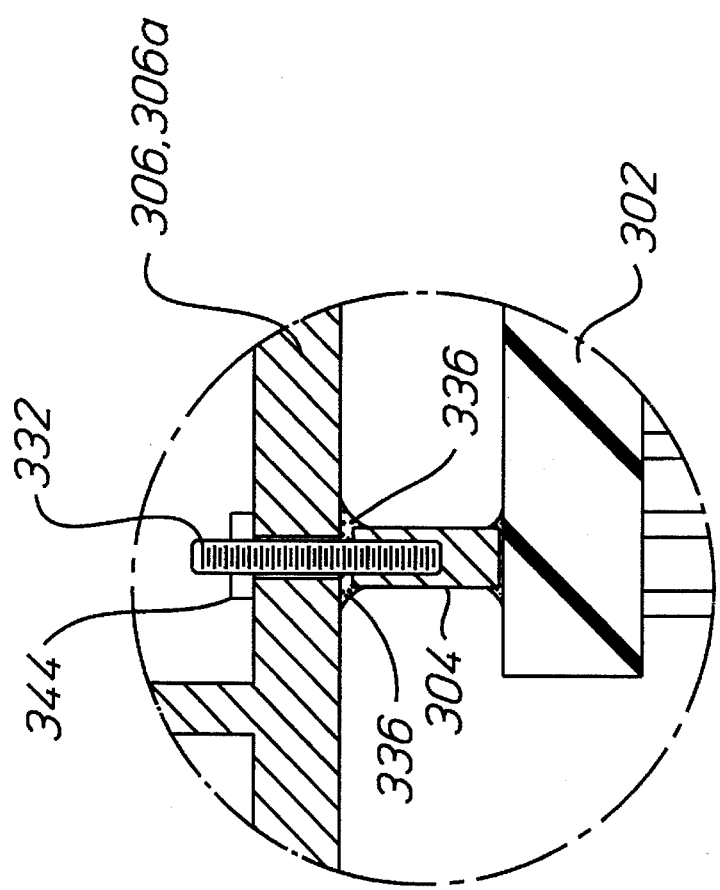
FIG. 4D shows the chip to lid attachment of FIG. 4A in further detail where the cross-sectional view of the lid attachment is taken through the fastening means.

The fastening means is mechanically coupled to the heat removal structure. FIGS. 3D and 4D show a cross-sectional view of the lid attachment of FIGS. 3A and 4A through the fastening means. Preferably, the fastening means 332 extends through an opening in the heat removal structure 306. In the embodiment shown in FIG. 5, the fastening means 332 are studs threaded at one end which extend through the coverplate and the heat sink and into the ring structure. Alternatively, the formed in the ring structure may be threaded and the stud may be screwed into the opening. Typically, one end of the stud is brazed or soldered in a recess or hole formed in the ring 304. Nuts 344 on the threaded end of the studs are tightened to fasten the heat sink the ring structure 304. Although the fastening means shown in FIG. 5 is a threaded stud, other fastening means may be used. For example, instead of studs, threaded holes in the top 324 of ring 304 allow fastening the ring structure to the heat sink using bolts.

The embodiment shown in FIGS. 4A–D is similar to that shown in FIGS. 3A–D. However, in comparison the coverplate 306b included in the heat removal structure 306 in FIGS. 3A–D is eliminated and the chip is attached to the heat sink by a die attach layer or a thermal grease layer. The embodiment shown in FIGS. 4A–D, is believed to be the preferred embodiment since it eliminates the coverplate 306b decreasing package cost. Further, it is believed that direct connection of the chip 316 to the heat sink increases thermal efficiency. The fastening means 332 extend from the ring structure 304 through the heat sink 306a where nuts fasten the heat sink 306a to the ring structure 304.

A lid attach layer 336 is used to join the Kovar ring structure 304 to the heat removal structure 306. The lid attach material can vary depending on the types of materials to be joined but some degree of seal hermeticity is required. Preferably for the optimum combination of cost, reliability and near-hermetic sealing capabilities, an organic bonding material such as epoxy or silicone is used. Alternatively, the ring structure 304 and heat removal structure 306 may be soldered together using techniques well known in the art.

Figure 1B:
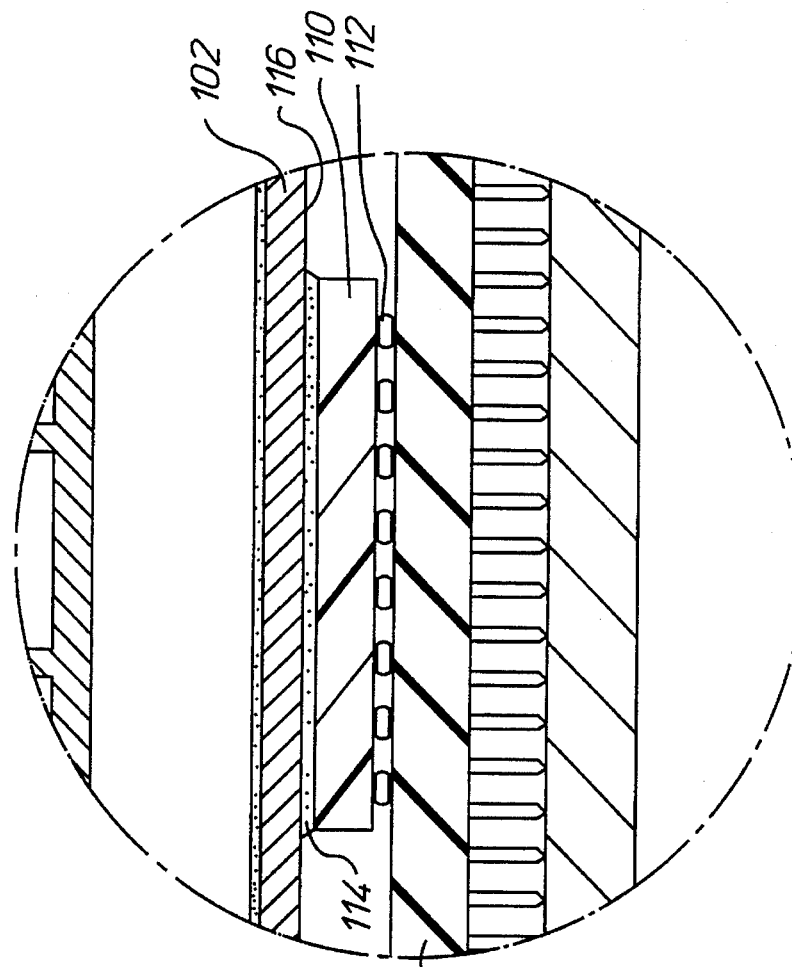
FIG. 1B shows the chip to lid interface and electrical interconnection of FIG. 1A in more detail and FIG. 1C shows the lid attachment of FIG. 1A in further detail.
Figure 1C:
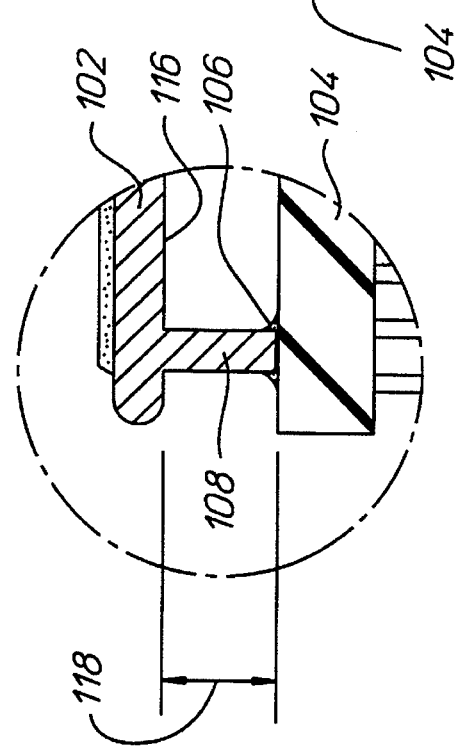

A die attach layer 330, positioned between the first major surface 318 of the die and the first major surface 326 of the heat removal structure, adheres the die 318 to and thermally couples the die 318 to the heat removal structure 306. To facilitate heat removal from the chip, the die attach material is a good thermal conductor to help pass heat from the chip to the heat sink. Unlike the die attach layer of the package described with reference to FIG. 1 and similar to the die attach layer described with reference to FIG. 2, the die attach 330 in the present invention has a predetermined controlled thickness selected to provide a low resistivity thermal connection between the backside 318 of the chip 316 and the heat removal structure 306. Die attach layer thickness is controlled in the fabrication process to provide substantial uniformity from one package to the next.

Die attach consistency between packages is enhanced, particularly in dealing with larger die sizes, by using a spacer (not shown). Thus, in an alternative embodiment, a spacer may be placed in the die attach material between the backside of the chip and the heat removal structure. The thickness of the spacer establishes a minimum thickness for die attach layer. The maximum thickness is determined by the particular choice of material and process conditions such as curing and loading.

While having a very small thickness of the die attach layer is ideal for thermal performance, having too thin a layer makes the die attach layer susceptible to high mechanical stress during thermal cycling. This susceptibility is in part, a function of the chip size. For large die, especially, it is important to have a predetermined controlled thickness of the thermal interface. The die attach material preferably has a thermal conductivity higher than 2W/M degrees Celsius. The die attach material is preferably of an epoxy base that has a glass transition point lower than 125 degrees Celsius (preferably 85 degrees Celsius) and can be either electrically conducting or nonconducting. A die attach thickness in the range of 1.0 mil ±60% provides for good thermal conductance for chips dissipating heat in the range of 40 to 60 watts. In the test summarized above, the die attach material was an electrically conducting silver-filled epoxy based material commercially available from Ablestik Company having a glass transition point of 85 degrees Celsius.

There is always a distribution of mechanical stress between the chip and the substrate. In the present invention, the ring structure 304 is brazed to the substrate. Further, the fastening means 332 is brazed to the ring structure and serves to mechanically fasten the heat removal structure 306. Mechanical stress on the heat sink is thus believed to be transferred primarily to the substrate through the threaded studs. Thus, the majority of the mechanical stress is transferred to the ceramic substrate 302.

Figure 2A:
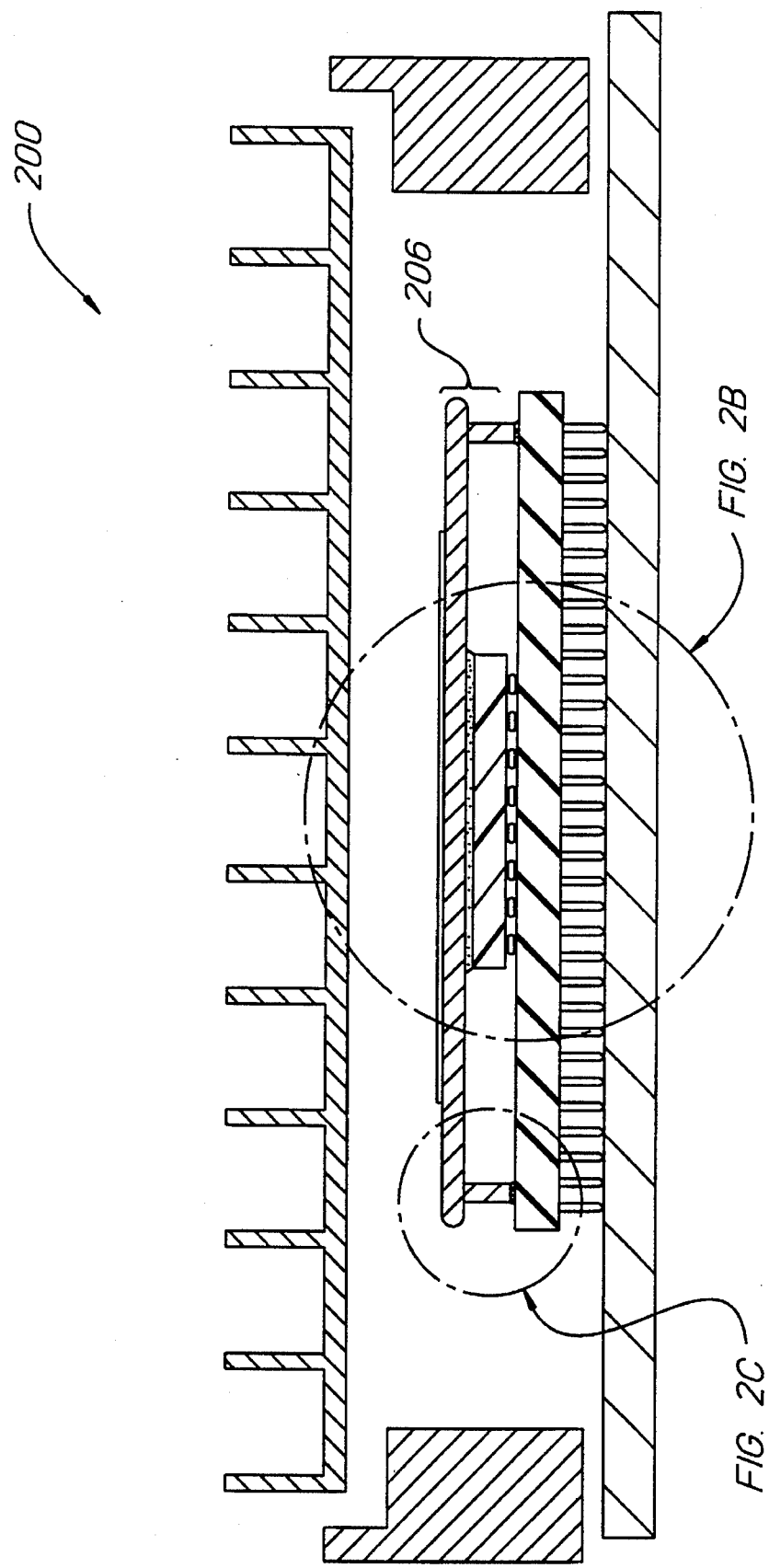
FIG. 2A is a schematic cross-sectional view of a flip chip package having a predetermined die attach layer thickness.
Figure 2B:
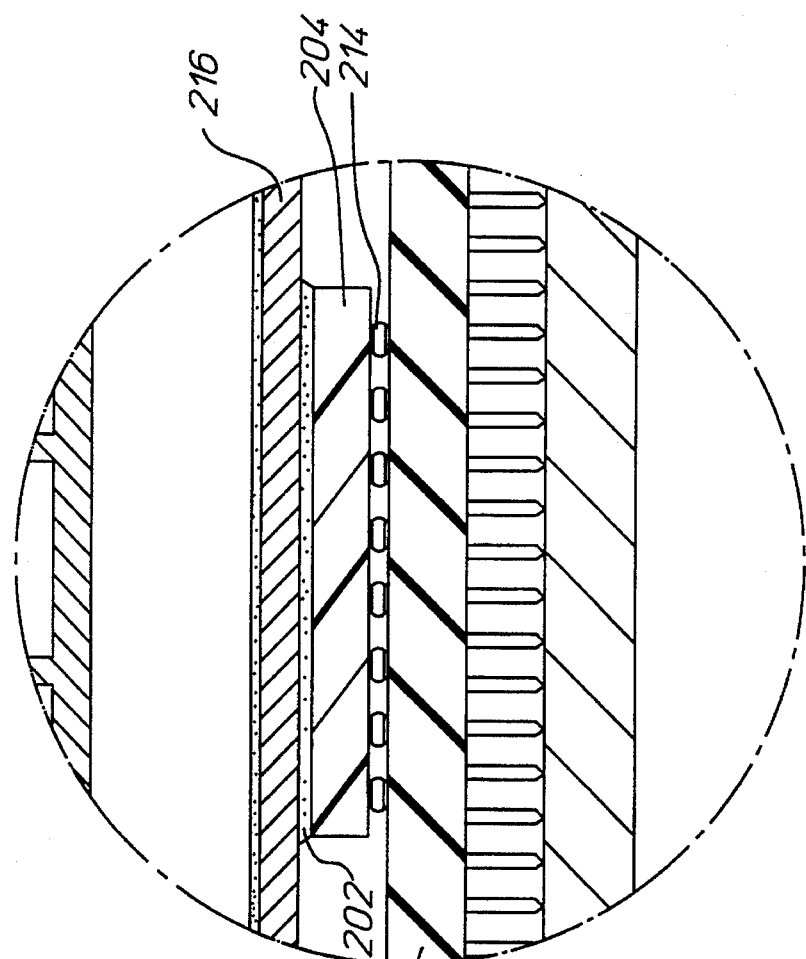
FIG. 2B shows the chip to lid interface and electrical connection of FIG. 2A in more detail and FIG. 2C shows the lid attachment of FIG. 2A in further detail.
Figure 2C:
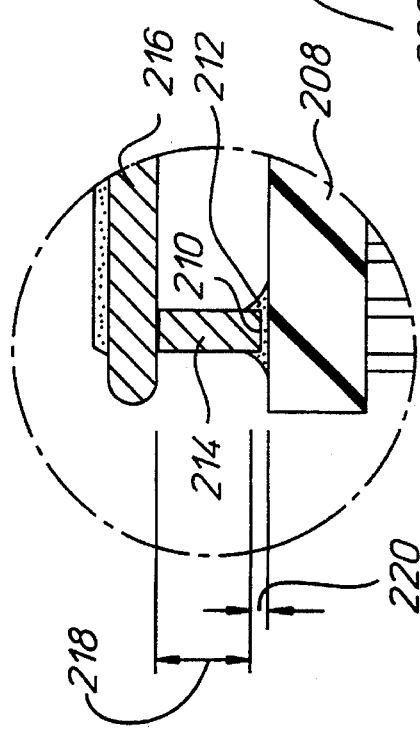

A tradeoff occurs between improved thermal performance and decreased mechanical stress to the chip. Although the package shown in FIGS. 2A–C provides more consistent thermal performance compared to the package of FIGS. 1A–C, the adhesive filled gap between the rim of the lid and the substrate (the lid attach material 212), provides more flexure. This increased flexure, results in increased mechanical stress being applied to the chip. In the present invention, the brazed joint 340 between the lid rim provides direct mechanical contact to the substrate 302. Since the brazed joint 340 between the substrate 302 and the ring structure 304 in the present invention provides a stiffer joint then the epoxy joint between the lid rim and the substrate shown in FIG. 2, the brazed joint described by the present invention decreases the mechanical stress transferred to the chip, thereby decreasing the probability of chip failure. The adhesive lid attachment to the ring also provides more flexure, but it functions mainly as a sealant, the lid being also mechanically fastened to the ring via studs and nuts.

The method of forming the integrated circuit package for an integrated circuit chip comprises the steps of: attaching a ring structure 304 to a substrate 302; electrically interconnecting the integrated circuit chip 316 to the substrate 308; attaching the integrated circuit chip 316 to a heat removal structure 306 and the ring structure 304 to the heat removal structure 306, wherein the step of attaching the ring structure 304 to the substrate 302 occurs before the step of attaching the ring structure 304 to the heat removal structure 306; and mechanically fastening the heat removal structure 306 to the ring structure 304.

A step in forming the integrated circuit package 300 is attaching the ring structure 304 to a substrate 308. In the preferred embodiment, the ring structure 304 is attached by brazing the ring structure to the first major surface of the substrate. Brazing and soldering is well known in the art and typically involves the attachment of two materials using an attachment or solder medium having a lower melting point than the two materials to be joined. Heat is applied so that the attachment material melts causing some interdiffusion of the attachment medium into the two materials to be joined.

Preferably, the ring structure 304 is attached to the ceramic substrate 302 by brazing at a temperature at or above 400 degrees Celsius. Dependent on the brazing methodology and temperatures used, an attachment material 342 may be placed between the first major surface of the substrate and the ring structure. During brazing, the attachment material 342 melts interdiffusing with the substrate and ring structure to form a joint.

In the preferred embodiment, the ring structure 304 is attached to the substrate by brazing. Typically, the step of brazing the ring structure 304 to the substrate 302 is performed before the step of electrically interconnecting the integrated circuit chip 316 to the connecting pattern 312 formed on the substrate. This is because the high temperatures typically associated with brazing may damage the integrated circuit chip.

Alternatively, the ring structure 304 may be attached to the substrate 302 by soldering at temperatures lower than 400 degrees Celsius. When soldering is used, the ring structure is typically soldered to a conductive pattern formed on the first major surface of the substrate, the conductive pattern matching the cross-section of the ring structure. A matching conductive pattern on the substrate may also be used when brazing the ring structure to the substrate, however, a matching conductive pattern is typically not necessary since the brazing temperature is usually sufficient to cause interdiffusion. Typically, when the ring structure 304 is soldered to the substrate 302, the ring structure 304 is soldered to the conductive pattern of the substrate 302 before the step of electrically interconnecting the chip to the substrate. However, at some solder temperature ranges, the integrated circuit chip will not be damaged, so that the integrated circuit chip may be electrically connected to the substrate before the step of attaching the ring structure to the substrate.

Alternatively, the ring structure 304 may be attached to the substrate 302 using a suitable adhesive such as epoxy. When attaching the ring structure using an adhesive, the order of the steps of attaching the ring structure to the adhesive and electrically interconnecting the chip to the substrate is not critical since typically adhering the ring structure occurs at low temperatures which do not damage the chip. When the ring structure is attached to the substrate, a sufficient load should be applied so that the ring structure makes direct mechanical contact to the substrate.

Comparing the attachment of the rim of the lid shown in FIGS. 2A–C with the attachment of the ring structure in FIGS. 3A–D, it can be seen that in the package shown in FIGS. 2A–C a predetermined gap or space exists between the rim of the lid and the substrate. In contrast, in the embodiments shown in FIGS. 3A–D and 4A–D, the ring structure is in mechanical contact with the substrate. Typically, any brazing material, solder material, or adhesive between the ring structure and the substrate is negligible. The negligible amount of brazing, solder or adhesive material remaining between the ring structure and the substrate is typically caused by nonplanarities between the surface of the ring structure and the surface of the substrate and is typically less than 0.1 mil.

A further step in forming the integrated circuit package 300 is electrically interconnecting the integrated circuit chip 316 to the substrate 302. The chip 316 is typically electrically interconnected to the substrate 302 by positioning the connecting pattern 313 on the active side of the integrated circuit chip to be aligned with and match a connecting pattern 312 formed on the first major surface of the substrate. The temperature is increased so that solder bumps positioned between the conductive pattern 313 on the active side of the chip and the conductive pattern 312 formed on the substrate are reflowed, resulting in direct bonding of the I/O pads of the chip to contact sites on the substrate. Typically after electrically interconnecting the chip 316 to the substrate 302, the space between the solder bumps and the substrate is filled with a resin which is referred to as the underfill. This resin has thermomechanical properties which increase the life of the electrical connections and is electrically conductive.

A further step in forming the described integrated circuit chip package 300 is attaching the integrated circuit chip 316 to the heat removal structure 306. In the embodiment shown in FIGS. 3A–D, the heat removal structure 306 includes a coverplate 306b and a heat sink 306a. In the embodiment shown in FIGS. 2A–C, the coverplate 306b is eliminated and heat removal structure 306 consists of only a heat sink 306a.

In order to provide good thermal dissipation, the chip 316 is attached to the heat removal structure using a die attach layer 330 which has low thermal resistance. Typically, to attach the chip 316 to the heat removal structure 306, a thin layer of die attach material is applied to the backside (the first major surface) of the integrated circuit chip. The die attach material should be of a predetermined thickness to provide a controlled low thermal resistance.

After the die attach material is applied to the chip 316, the chip 316 and heat removal structure 306 are brought into contact with each other so that the chip is attached to the heat removal structure resulting in the chip being thermally coupled to the heat removal structure. In the embodiment shown in FIGS. 3A–D, the die attach material 330 is between the coverplate 306b and the chip 316. In the embodiment shown in FIGS. 4A–D, the die attach material 330 is positioned between the heat sink 306a and the chip 316.

A further step in the formation of the integrated chip package 300 is the step of attaching the ring structure 304 to the heat removal structure 306. Typically, the ring structure is attached to the heat removal structure by applying an adhesive to top surface 324 of the ring structure 304 and bringing the ring structure 304 into contact with the heat removal structure 306 creating a seal between the ring structure 304 to the heat removal structure 306.

The cover plate 306b is simultaneously attached thermally to the chip and mechanically to the ring structure 304. Thus, the step of bringing the ring structure 304 into contact with the heat structure 306 (through the lid attach material 336) typically occurs simultaneously with the step of bringing the heat removal structure 306 into contact with the die 316 (through the die attach material 330). In the preferred embodiment, first the die attach material 330 is applied to the back or first major surface 318 of the chip 316 and the lid attach material 336 (the adhesive between the ring structure and the heat removal structure) is applied to the top surface of the ring structure. This is followed by the step of positioning the heat removal structure 306 above the ring structure 304, typically so that a first major surface 326 of the heat removal structure 306 is generally orthogonal to the sidewalls of the ring structure 304.

After the heat removal structure 306 is correctly positioned, a load is applied to the heat removal structure causing the heat removal structure 306 to contact the lid attach material and thus seal the ring structure 304, and simultaneously cause the heat removal structure surface to contact the die attach material 330 on the backside of the integrated circuit chip 316. Although there are many ways of applying a load, typically the load is a weight or alternatively may be a spring force such as from a clamp. In this particular application, typically a load of two to three pounds is applied. After contact is made, a curing step to cure the die attach and lid attach materials is applied.

It is understood that the above description is intended to be illustrative and not restrictive. The scope of the invention should be determined not with reference to the above description, but instead should be determined with reference to the appended claims along with the full scope of the equivalents to which such claims are entitled.

What is claimed is:

1. A method of forming an integrated circuit package comprising the steps of:

attaching a ring structure to a substrate;

electrically interconnecting an integrated circuit chip to the substrate;

attaching the integrated circuit chip to a heat removal structure; and attaching the ring structure to the heat removal structure by mechanically fastening the heat removal structure, wherein the step of attaching the ring structure to the substrate occurs before the step of attaching the ring structure to the heat removal structure and wherein the fastening means includes a stud having a first end and a second opposite end, the first end of the stud being brazed to the ring structure.

2. The method recited in claim 1 wherein the second end of the stud is threaded and wherein the heat removal structure is mechanically fastened to the ring structure using nuts fitting the second end of the stud.

3. A method of forming an integrated circuit package comprising the steps of:

attaching a ring structure to a substrate;

electrically interconnecting an integrated circuit chip to the substrate;

attaching the integrated circuit chip to a heat removal structure; and attaching the ring structure to the heat removal structure by mechanically fastening the heat removal structure, wherein the step of attaching the ring structure to the substrate occurs before the step of attaching the ring structure to the heat removal structure and wherein the fastening means includes a bolt having a first end and a second opposite end, the first end of the bolt being screwed into an opening in the ring structure, the second end of the bolt extending through the heat removal structure.

4. A package for an integrated circuit chip comprising:

a substrate having a first and second major surface;

a ring structure attached to the first major surface of the substrate;

a heat removal structure, an integrated circuit chip being thermally and mechanically coupled to the heat removal structure by a die attach layer having a predetermined thickness, the die attach layer being positioned between a second major surface of the integrated circuit and a first major surface of the heat removal structure, a second major surface of the integrated circuit chip being electrically interconnected to a connecting pattern on the first major surface of the substrate; and a fastening means extending from the ring structure, the fastening means mechanically coupling the ring structure to the heat removal structure, wherein the fastening means is brazed to the surface of the ring structure.

5. A package for an integrated circuit chip comprising:

a substrate having a first and second major surface;

a ring structure attached to the first major surface of the substrate;

a heat removal structure, an integrated circuit chip being thermally and mechanically coupled to the heat removal structure by a die attach layer having a predetermined thickness, the die attach layer being positioned between a second major surface of the integrated circuit and a first major surface of the heat removal structure, a second major surface of the integrated circuit chip being electrically interconnected to a connecting pattern on the first major surface of the substrate; and a fastening means extending from the ring structure, the fastening means mechanically coupling the ring structure to the heat removal structure, wherein the fastening means is brazed to an opening formed in the ring structure, the fastening means extending from the ring structure to the heat removal structure.

\* \* \* \* \*